United States Patent
Abe et al.

(10) Patent No.: US 10,586,479 B2
(45) Date of Patent: Mar. 10, 2020

(54) DISPLAY DEVICE

(71) Applicant: Japan Display Inc., Minato-ku (JP)

(72) Inventors: Hiroyuki Abe, Minato-ku (JP);
Kentaro Agata, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 16/104,152

(22) Filed: Aug. 17, 2018

(65) Prior Publication Data

US 2019/0066556 A1 Feb. 28, 2019

(30) Foreign Application Priority Data

Aug. 23, 2017 (JP) ................................ 2017-159963

(51) Int. Cl.
| | |
|---|---|
| *G09G 3/00* | (2006.01) |
| *G09G 3/3225* | (2016.01) |
| *G09G 3/36* | (2006.01) |
| *G02F 1/1345* | (2006.01) |
| *H01L 27/32* | (2006.01) |
| *G02F 1/1362* | (2006.01) |
| *G02F 1/1368* | (2006.01) |

(52) U.S. Cl.
CPC ......... *G09G 3/006* (2013.01); *G02F 1/13452* (2013.01); *G02F 1/136286* (2013.01); *G09G 3/3225* (2013.01); *G09G 3/3648* (2013.01); *H01L 27/3276* (2013.01); *G02F 1/1368* (2013.01); *G02F 2001/13685* (2013.01); *G09G 2330/12* (2013.01)

(58) Field of Classification Search
None
See application file for complete search history.

(56) References Cited

U.S. PATENT DOCUMENTS

| | | | | |
|---|---|---|---|---|
| 6,624,857 | B1* | 9/2003 | Nagata | G02F 1/1309 349/139 |
| 9,581,841 | B2* | 2/2017 | Yanagisawa | G02F 1/1309 |
| 2002/0044124 | A1* | 4/2002 | Yamazaki | G09G 3/006 345/92 |
| 2003/0085855 | A1* | 5/2003 | Tomita | G09G 3/006 345/87 |
| 2012/0001950 | A1* | 1/2012 | Kim | G09G 3/3291 345/690 |

(Continued)

FOREIGN PATENT DOCUMENTS

JP 2007-140378 6/2007

*Primary Examiner* — David D Davis
(74) *Attorney, Agent, or Firm* — Oblon, McClelland, Maier & Neustadt, L.L.P.

(57) ABSTRACT

An inspection circuit is properly protected in a display device, which the driver IC is not on the terminal area. A liquid crystal display device comprising a TFT substrate having a display area, in which video signal lines are formed, and a terminal area; a counter substrate overlapping with the display area of the TFT substrate; the counter substrate and the TFT substrate are adhered by the seal material, the display area is formed in an area surrounded by the seal material; wherein the flexible wiring circuit substrate connects to the terminal area, the driver IC, which supplies video signals to the video signal lines, is not installed in the terminal area, the inspection circuit is formed between the display area and the terminal area, wherein the inspection circuit overlaps with the counter substrate in a plan view.

3 Claims, 17 Drawing Sheets

(56) References Cited

U.S. PATENT DOCUMENTS

| | | | | |
|---|---|---|---|---|
| 2012/0212684 A1* | 8/2012 | Ochiai | ............... | G02F 1/13458 |
| | | | | 348/790 |
| 2014/0117334 A1* | 5/2014 | Nakamura | ........... | H01L 27/322 |
| | | | | 257/40 |
| 2014/0217412 A1* | 8/2014 | Yanagisawa | .......... | G02F 1/1309 |
| | | | | 257/66 |
| 2015/0077317 A1* | 3/2015 | Miyamoto | ............ | G02F 1/1345 |
| | | | | 345/87 |
| 2015/0286084 A1* | 10/2015 | Yoshida | .............. | H01L 27/1214 |
| | | | | 257/43 |
| 2015/0301420 A1* | 10/2015 | Yoshida | ................ | G02F 1/1345 |
| | | | | 257/43 |
| 2016/0238862 A1* | 8/2016 | Nishino | ................ | G02F 1/1309 |
| 2016/0293889 A1* | 10/2016 | Nakamura | .......... | H01L 51/5256 |
| 2017/0123249 A1* | 5/2017 | Yoshida | .............. | G02F 1/13452 |
| 2017/0237033 A1* | 8/2017 | Koshihara | ............. | H01L 27/322 |
| | | | | 257/88 |

* cited by examiner

DISPLAY DEVICE

CLAIM OF PRIORITY

The present application claims priority from Japanese Patent Application JP 2017-159963 filed on Aug. 23, 2017, the content of which is hereby incorporated by reference into this application.

BACKGROUND OF THE INVENTION

(1) Field of the Invention

The present invention relates to a display device, specifically to a placement of the inspection circuit and a method of inspection when the driver IC is removed from the terminal area to narrow the frame area of the display device.

(2) Description of the Related Art

A liquid crystal display device has a TFT substrate, a counter substrate opposing to the TFT substrate, and a liquid crystal layer sandwiched between the TFT substrate and the counter substrate. The TFT substrate has plural pixels; each of the pixels has a pixel electrode and a thin film transistor (TFT). Each of the pixels is in an area surrounded by the scanning lines and video signal lines. A transmittance of light in each pixel is controlled by liquid crystal molecules; thus, images are formed.

The organic EL display device has a structure that the TFT substrate is covered by the protecting film, wherein the pixels having the light emitting elements and TFTs are formed in a matrix form on the TFT substrate. Both the liquid crystal display device and the organic EL display device are thin and light weight display devices, thus, they are utilized in various fields.

In such displays, there is a demand that the display area is enlarged while the outer size of the display device is kept in the same size. Those displays are called narrow frame displays. In such displays, however, the wiring density of in the frame area becomes high. The patent document 1 (Japanese patent laid open 2007-140378) discloses the placement of the inspection circuits and the inspection terminals in such narrow frame display devices.

SUMMARY OF THE INVENTION

There is a strong demand to enlarge the display area while the outer size is not enlarged in e.g. the liquid crystal display devices. The terminal area is necessary to supply powers and signals to the liquid crystal display device; however, the width of the terminal area also must be narrowed in the narrow frame display device. Generally, the driver IC, which forms the video signals according to signals supplied from outside, is placed on the terminal area, and the flexible wiring circuit substrate is connected to the terminal to supply powers and signals.

If the terminal area is further narrowed, the driver IC is removed from the terminal area and is set on the flexible wiring circuit substrate. On the other hand, the liquid crystal display device must be inspected to check whether the wirings have any defects like shorts or disconnections before the display device is completed.

When the driver IC is removed from the terminal area, the disposition of the inspection circuit becomes a problem. The purpose of the present invention is to solve the problem of the disposition of the inspection circuit when the driver IC is disposed on the flexible wiring circuit substrate and the flexible wiring circuit substrate is directly connected with the display area.

The present invention overcomes the above explained problem; the concrete structures are as follows.

(1) A liquid crystal display device comprising: a TFT substrate having a display area, in which video signal lines are formed, and a terminal area, a counter substrate overlapping with the display area of the TFT substrate;
wherein a plurality of first terminals to connect with the flexible wiring circuit substrate and a plurality of second terminals, which are used in an inspection process are formed in the terminal area,
an inspection circuit is formed between the display area and the terminal area in a plan view in the TFT substrate,
the inspection circuit has a plurality of switching portions to connect the video signal line to either one of the first terminal or the second terminal,
an insulating film is formed on the inspection circuit at the surface opposing to the counter substrate.

(2) An organic EL display device comprising: a TFT substrate having a display area, in which video signal lines are formed, and a terminal area;
wherein an anode is formed on a first organic insulating film, an organic EL layer is formed on the anode, a cathode is formed on the organic EL layer, an inorganic insulating film is formed on the cathode, and a polarizing plate is set on the inorganic insulating film,
a plurality of first terminals to connect with a flexible wiring circuit substrate and a plurality of second terminals utilized in an inspection process are formed in the terminal area,
an inspection circuit is formed between the display area and the terminal area in a plan view in the TFT substrate,
the inspection circuit has a plurality of switching portions to connect the video signal line to either one of the first terminal or the second terminal,
the first organic insulating film is formed on the inspection circuit at the surface opposing to the polarizing plate.

DETAILED DESCRIPTION OF THE PREFERRED EMBODIMENTS

The present invention will be described in detail referring to the following embodiments. The explanation below is made mainly for the liquid crystal display device; however, the present invention is applicable to other displays like e.g. the organic EL display device.

Embodiment 1

Figure 1:
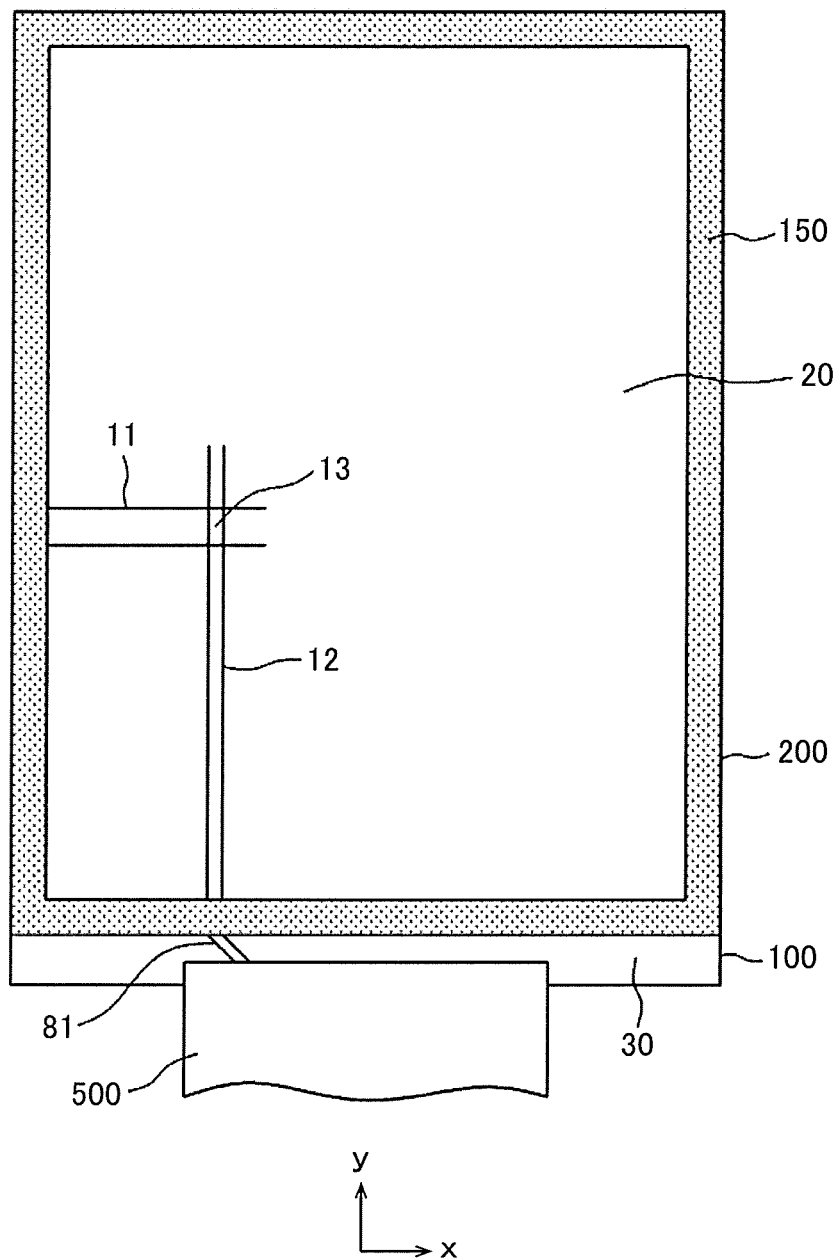
FIG. 1 is a plan view of the liquid crystal display device, which the present invention is applied.

FIG. 1 is a plan view of the liquid crystal display device, which the present invention is applied. In FIG. 1, the TFT substrate 100 and the counter substrate 200 are adhered at their peripheries by the seal material 150; the liquid crystal is sealed inside. In the display area 20, scanning lines 11 extend in the lateral direction (x direction) and are arranged in the longitudinal direction (y direction); the video signal lines 12 extend in the longitudinal direction and are arranged in the lateral direction. The pixel 13 is formed in the area surrounded by the scanning lines 11 and the video signal lines 12.

In FIG. 1, the TFT substrate 100 is formed bigger than the counter substrate 200; the area that the TFT substrate 100 does not overlap with the counter substrate 200 is the terminal area 30. The flexible wiring circuit substrate 500 connects with the terminal area 30. Powers, scanning signals, video signals, clock signals are supplied to the liquid crystal display device through the flexible wiring circuit substrate 500. The display area 20 and the flexible wiring circuit substrate 500 are connected through the terminal wirings 81.

The feature of FIG. 1 is that the driver IC is not installed in the terminal area 30, but only the flexible wiring circuit substrate 500 is connected to the terminal area 30. Therefore, the area of the terminal area can be diminished; consequently, the width of the frame can be narrowed. The driver IC is installed in the flexible wiring circuit substrate 500.

Figure 2:
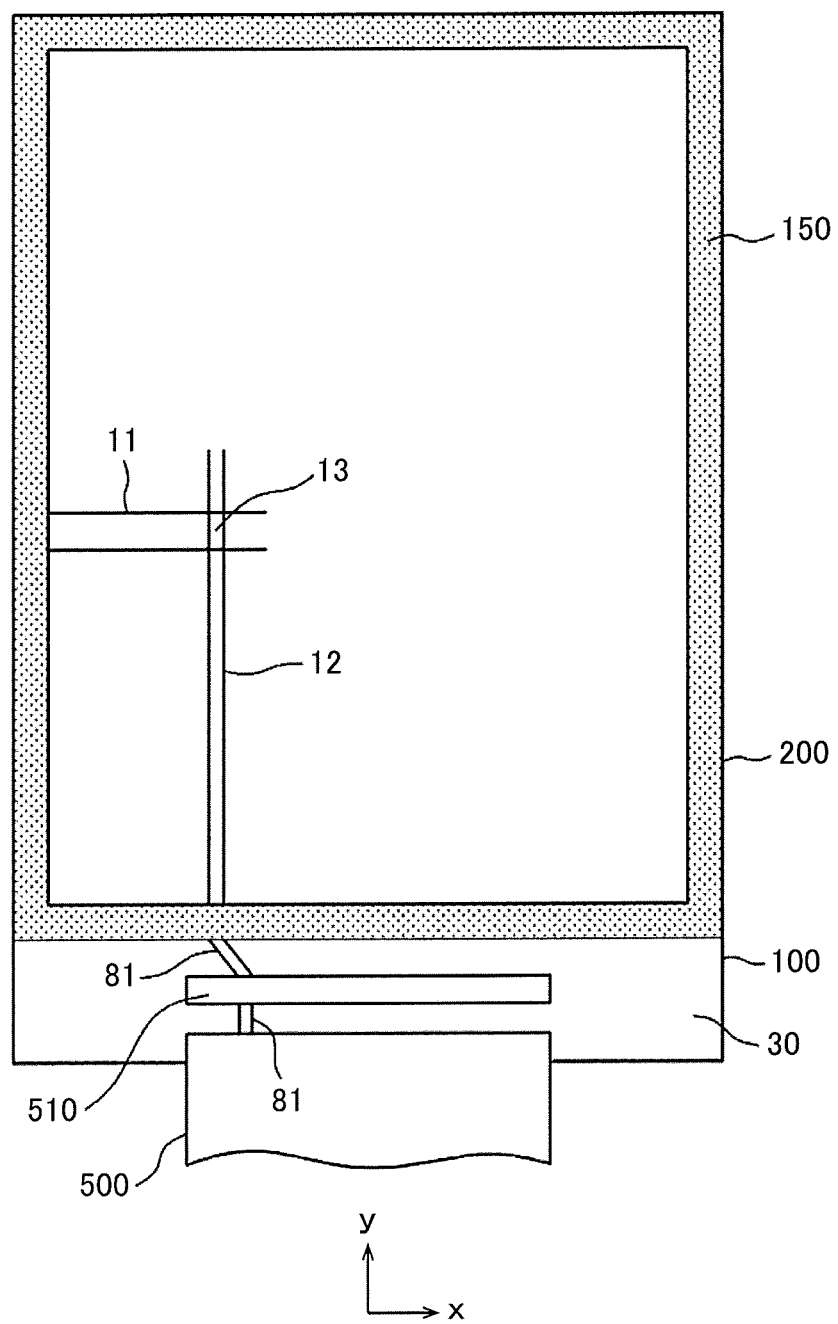
FIG. 2 is a plan view of the conventional liquid crystal display device.

FIG. 2 is an example of a plan view of the conventional liquid crystal display device. In FIG. 2, the display area 20 is the same as FIG. 1. In FIG. 2, however, the driver IC 510 is installed in the terminal area 30 and the flexible wiring circuit substrate 500 is connected to the terminal area 30. Therefore, the terminal area 30 in FIG. 2 is bigger than that of FIG. 1; consequently, it has a problem for a narrow frame area.

The terminal area in the liquid crystal display device of FIG. 1, which the present invention is applied, can be diminished; however, the disposition of the inspection circuit becomes a problem. In the conventional structure, the inspection circuit is disposed at the area where the driver IC is connected in the terminal area. Namely, in the conventional structure, the inspection circuit is covered and physically protected by the driver IC 510 because the inspection circuit is disposed under the IC chip. The present invention enables to realize a highly reliable disposition of the inspection circuit and a method of the inspection in the structure of FIG. 1 where the flexible wiring circuit substrate 500 and the display area 20 are directly connected through the wirings 81, namely, the driver IC is not in the terminal area 30.

Figure 3:
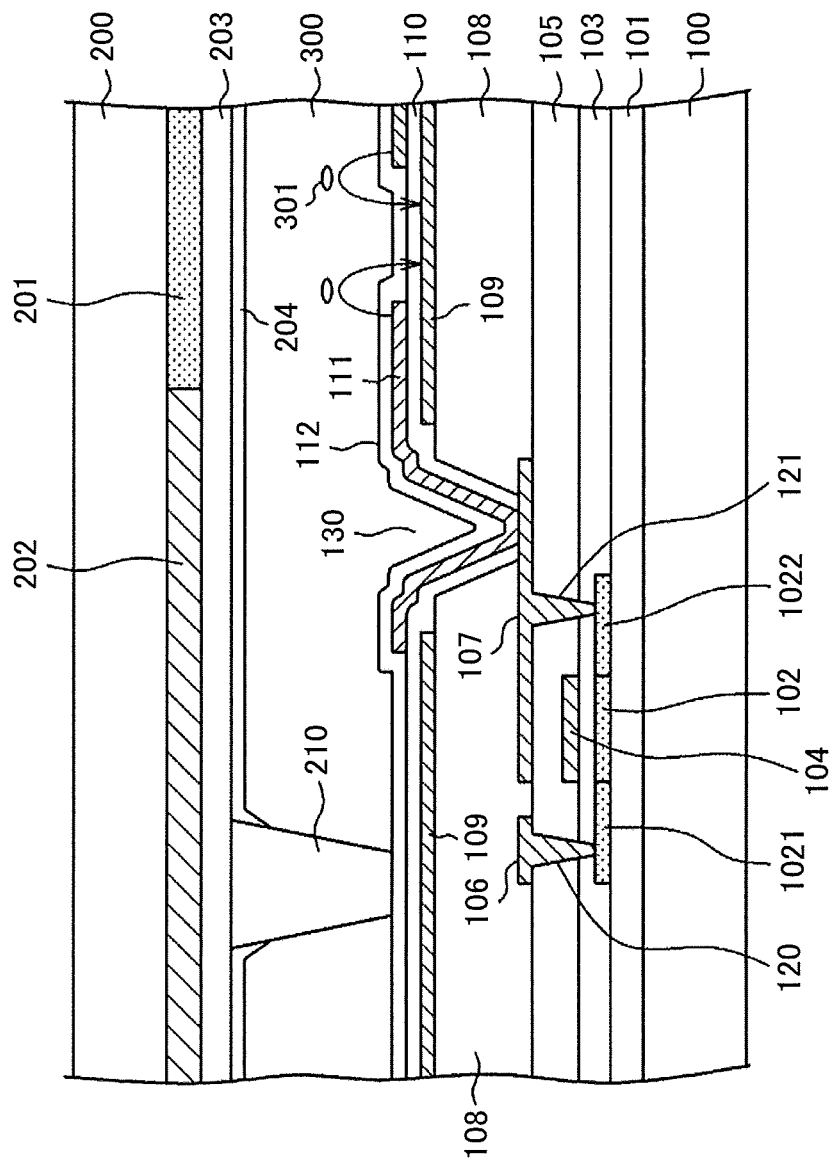
FIG. 3 is a cross sectional view of the display area of the liquid crystal display device.
Figure 4:
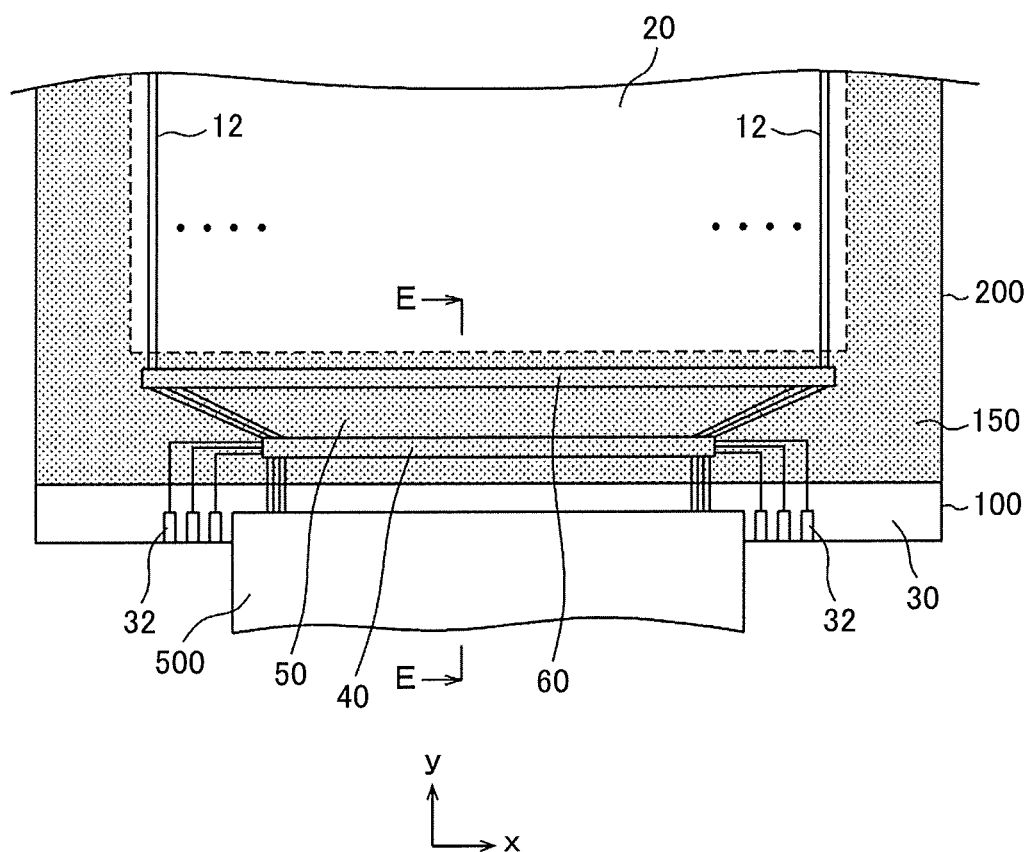
FIG. 4 is a plan view of the terminal area and its vicinity of the liquid crystal display device.

FIG. 3 is a cross sectional view of the display area of FIG. 1. The display area 20 and the terminal area 30 are formed simultaneously in the TFT substrate, thus, FIG. 3 is for the explanation of the basic layer structure of the display device. In FIG. 4 and the following figures explain the structure of the terminal area and the seal area at the vicinity of the terminal area; however, TFTs and the wirings in the selecting circuit, the inspection circuit and so on are formed on the same layers and formed by the same process as for the TFTs or wirings in FIG. 3. FIG. 3 is a cross sectional view of the IPS (In Plane Switching) type liquid crystal display device.

In FIG. 3, the TFT substrate 100 is generally formed by glass; however, when a flexible display is required, the TFT substrate 100 is formed by resin like e.g. polyimide. The undercoat 101, which is a laminated film of the silicon oxide (SiO) and the silicon nitride (SiN), is formed on the TFT substrate 100. The role of the undercoat 101 is to prevent the semiconductor layer 102 from being contaminated by the impurities from the TFT substrate 100.

The semiconductor layer 102 is formed on the undercoat 101. The semiconductor layer 102 is generally formed by the polycrystalline silicon (poly-silicon). Since the poly-silicon has a high mobility, the peripheral circuit as e.g. the scanning line driving circuit can be formed simultaneously on the TFT substrate. Other examples for the semiconductor layer 102 are e.g. the amorphous silicon, the oxide semiconductor like IGZO (Indium Gallium Zinc Oxide).

The gate insulating film 103 is formed covering the semiconductor layer 102. The gate insulating film 103 is the SiO film formed by CVD using TEOS (Tetraethoxysilane) as the material. The gate electrode 104 is formed on the gate insulating film 103. The gate electrode 104 is made of e.g. MoW and formed simultaneously with the scanning lines 11. Further, parts of the terminal wirings in the terminal area 30 are formed by the same material and by the same process as the gate electrode 104.

After the gate electrode 104 is patterned, e.g. Phosphor (P) or Boron (B) is doped by the ion implantation to give conductivity to the semiconductor layer 102 other than the area under the gate electrode 104. The area directly under the gate electrode 104 becomes the channel 102; other areas become the drain region 1021 or source region 1022.

After that, the interlayer insulating film 105 is formed. The interlayer insulating film 105 is formed by either one of the SiO film or the SiN film or the lamination film of the SiO film and the SiN film. The through hole 120 is formed in the interlayer insulating film 105 and the gate insulating film 103 to connect the drain electrode 106 and the drain region 1021; the through hole 121 is formed to connect the source electrode 107 and the source region 1022. The drain electrode 106 and the source electrode 107 are formed simultaneously. The video signal lines 12 are formed simultaneously with the drain electrodes 106 and the source electrodes 107. Further, parts of the terminal wirings in the terminal area are formed simultaneously with the drain electrode 106 and etc. The drain electrode 106 or source electrode 107 are formed by e.g. Aluminum (Al) or its alloy sandwiched by Titan (Ti) or by e.g. MoW.

The organic passivation film 108 is formed by transparent resin, like acrylic, over the drain electrode 106 and the source electrode 107. Since the organic passivation film 108 has also a role of the flattening film, it is formed as thick as 2 µm to 4 µm. The through hole 130 is formed in the organic passivation film 108 to connect the source electrode 107 and the pixel electrode 111, which is formed later.

The common electrode 109 is formed on the organic passivation film 108 by the transparent oxide conductor as e.g. ITO. The common electrode 109 is formed in common among the pixels. The capacitance insulating film 110 is formed by SiN over the common electrode 109. The pixel electrode 111 is formed on the capacitance insulating film 110 by the transparent oxide conductor as e.g. ITO. The ITO constituting the common electrode 109 and the ITO constituting the pixel electrode 111 also constitute parts of the terminal wirings or terminals in the terminal area 30. The ITO that constitutes the common electrode 109 may be called the first ITO and the ITO that constitutes the pixel electrode 111 may be called the second ITO.

The alignment film 112 is formed on the pixel electrode 111 for the initial alignment of the liquid crystal molecules 301. The pixel electrode 111 is formed like stripe shaped or comb shaped; when a signal voltage is applied to the pixel electrode, the line of force as depicted in FIG. 3 is generated between the pixel electrode 111 and the plane shaped common electrode 109; consequently the liquid crystal molecules 301 are rotated by the field, thus, the amount of light that passes the liquid crystal layer 300 is controlled.

In FIG. 3, the counter substrate 200 is set over the TFT substrate 100 sandwiching the liquid crystal layer 300. The counter substrate 200 is generally formed by glass; however, when a flexible display is required, the counter substrate 200 is formed by resin, like e.g. polyimide. The color filter 201 and the black matrix 202 are formed on inner side of the counter substrate 200; the overcoat 203 is formed covering them. The columnar spacers 210 are formed on the overcoat 203, which control the space between the TFT substrate 100 and the counter substrate 200. The alignment film 204 is formed on the overcoat 203.

FIG. 3 is a layer structure of the display area of the liquid crystal display device; however, the TFTs in the selecting circuit and inspection circuit, etc. formed in the terminal area 30 and in the frame area have the same structure as explained in FIG. 3. Further, wirings in the selecting circuit and inspection circuit, etc. formed in the terminal area 30 and in the frame area are formed simultaneously with the gate electrode 104, the drain electrode 106, the source electrode 107, the first ITO 109 and the second ITO 111 in FIG. 3.

FIG. 4 is an enlarged plan view of the terminal area 30 and its vicinity. In FIG. 4, the TFT substrate 100 and the counter substrate 200 adhere to each other by the seal material 150; the display area 20 is surrounded by the seal material 150. The TFT substrate 100 that does not overlap with the counter substrate 200 is the terminal area 30; the signal terminals 31 (which are not shown in FIG. 4) for connecting with the flexible wiring circuit substrate 500 and the inspection terminals 32 for the inspection are formed in the terminal area 30.

The video signal lines 12 extend in the longitudinal direction (y direction) in the display area 20. The number of the video signal lines 12 are so large, thus, the selecting circuit 60 is formed to decrease the number of wirings at the terminal area 30. The selecting circuit 60 is a switching circuit formed by TFTs. For example, when the signals for the red pixels, green pixels and blue pixels are written separately, the number of terminal wirings can be decreased to ⅓.

The wirings from the selecting circuit connect 60 with the inspection circuit 40 via the tilted wiring region 50. The inspection circuit 40 is also a switching circuit that has many TFTs. The inspection circuit 40 switches signals supplied from the signal terminal 31 or the inspection terminal 32 so that they can be transmitted to each of the tilted wiring region. The inspection process is conducted through the inspection terminals 32 before the flexible wiring circuit substrate 500 is connected.

In this embodiment, the counter substrate 200 covers the inspection circuit 40 as depicted in FIG. 4. Therefore, the inspection circuit 40, which has many TFTs, is protected by the counter substrate 200 and the seal material 150. The tilted wiring region 50 extend to the terminal area 30 and connect with the terminals formed in the terminal area 30. The flexible wiring circuit substrate 500 is connected to the terminals. The driver IC is not installed in the terminal area 30 but is installed in the flexible wiring circuit substrate 500 in FIG. 4.

The structure that the driver IC 510 is installed in the terminal area 30 of the TFT substrate 100 is called COG (Chip On Glass); the structure that the driver IC 510 is installed in the flexible wiring circuit substrate 500 is called COF (Chip On Film). The video signals that are supplied to each of the video signal lines 12 are arranged by the driver IC. Namely, video signals, supplied from outside in serial, are transformed to parallel arrangement by the driver IC, and supplied to the display area 20 of the liquid crystal display device. Therefore, in the case of COF, as the case in the present invention, the number of terminals increases greatly compared with the case of COG. For example, the number of terminals in COG is around 300, while the number of the terminals in COF increases 5 or six times, which makes as many as 1500 to 1800.

Figure 5:
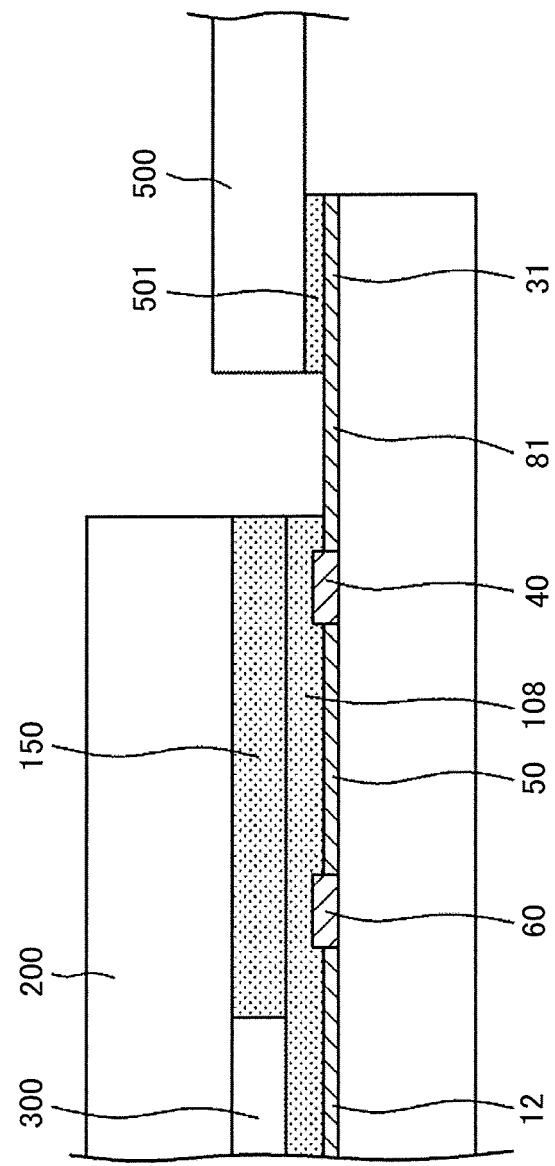
FIG. 5 is a cross sectional view of FIG. 4 along the E-E line.

FIG. 5 is a schematic cross sectional view along E-E line of FIG. 4. In FIG. 5, the TFT substrate 100 and the counter substrate 200 are adhered by the seal material 150; the liquid crystal 300 is sealed inside. The video signal lines 12, the selecting circuit 60, the tilted wiring region 50, the inspection circuit 40, terminal wiring 81 and signal terminal 31 are formed on the TFT substrate 100.

In FIG. 5, the selecting circuit 60, the tilted wiring region 50, the inspection circuit 40, etc. are covered by the organic passivation film 108, and further, are protected by the seal material 150 and the counter substrate 200. The terminal wirings 81 extend from the inspection circuit 40 to the signal terminals 31. The signal terminals 31 are connected to the flexible wiring substrate 500 through the ACF (Anisotropic Conductive Film) 501. In the meantime, the terminal wirings 81 may be exposed or covered by the capacitance insulating film 110 made of SiN or the organic passivation film 108, which are depicted in FIG. 3.

The feature of FIG. 5 is that the inspection circuit 40, which has a lot of TFTs, is protected by the organic passivation film 108, the seal material 150 or the counter substrate 200, etc. Therefore, the reliability of the inspection circuit 40 is maintained.

Figure 6:
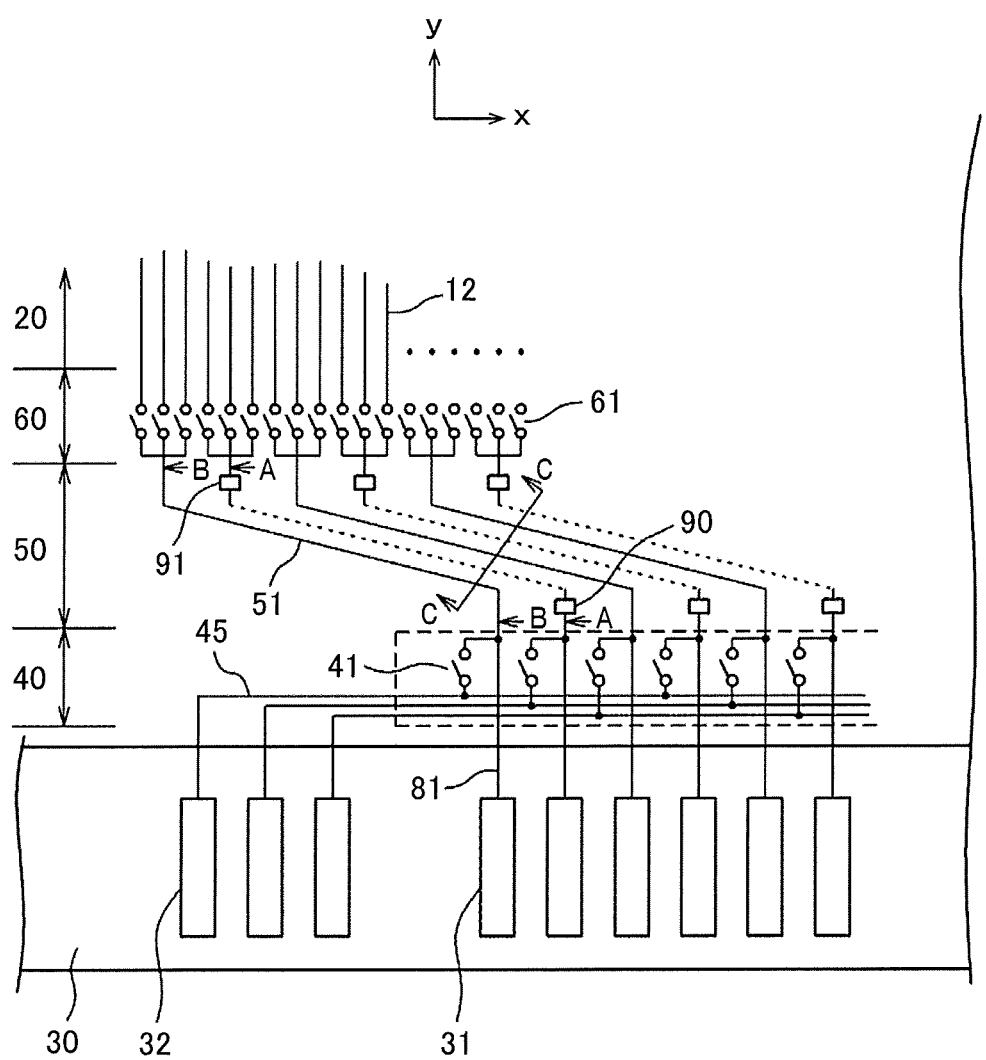
FIG. 6 is an example of the equivalent circuit of FIG. 4.

FIG. 6 is the equivalent circuit corresponding to FIG. 4. The circuit in FIG. 6 is simplified for easy understanding. In FIG. 6, the video signal lines 12 extend in the longitudinal direction (y direction) toward the display area 20 from the selecting circuit 60. The selecting circuit 60 has many switches formed by TFTs. The selecting circuit 60 enables to write the data three times in one frame period; thus, the number of the wirings from the selecting circuit 60 to the terminal area 30 can be decreased to ⅓.

The tilted wiring region 50 is formed to connect the selecting circuit 60 and the inspection circuit 40. The pitch of the wirings in the signal terminals 31 is smaller compared with the pitch of the wirings in the selecting circuit 60; thus, the tilted wirings 51 are formed between the selecting circuit 60 and the inspection circuit 40. Since the pitch of the wirings in the tilted wirings 51 is smaller than the pitch of the wirings that extend in the longitudinal direction (y direction), it is difficult to maintain the space between the wirings in the tilted wiring region 50. Therefore, the tilted wirings 51 have multi-layer wirings structure.

Figure 7:
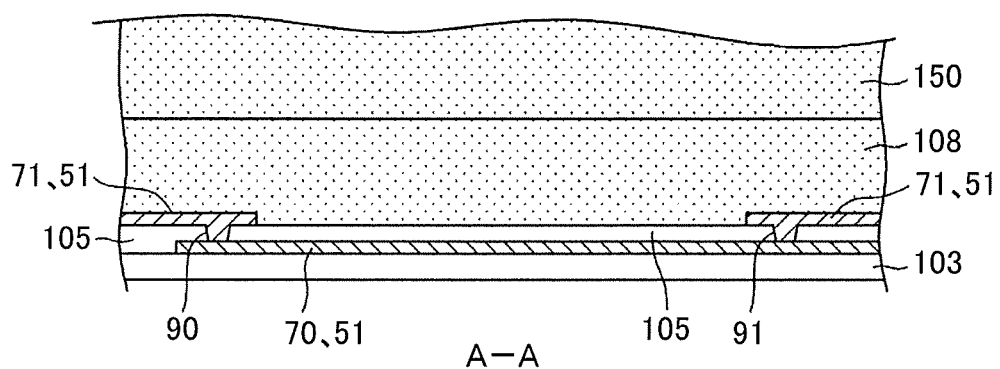
FIG. 7 is a cross sectional view of FIG. 6 along the A-A line.

Namely, in the tilted wiring region 50, the every other tilted wiring 51 has through holes 90 and 91 to change the layer from e.g. the drain layer to the gate layer. FIG. 7 is cross sectional view along the line A-A in the tilted wiring region 50 of FIG. 6. The wiring 71, 51, which is formed on the same layer as the drain electrode 106 (video signal line 12), extends from the selecting circuit 60 and changes its layer to the same layer as the gate electrode 104 (scanning line 11) via through hole 91 to become the wiring 70, 51; and when the tilted wiring region 50 ends, the wiring 70, 51 changes its layer to the wiring 71, 51, which is on the same layer as the video signal line 12 via the through hole 90.

Figure 8:
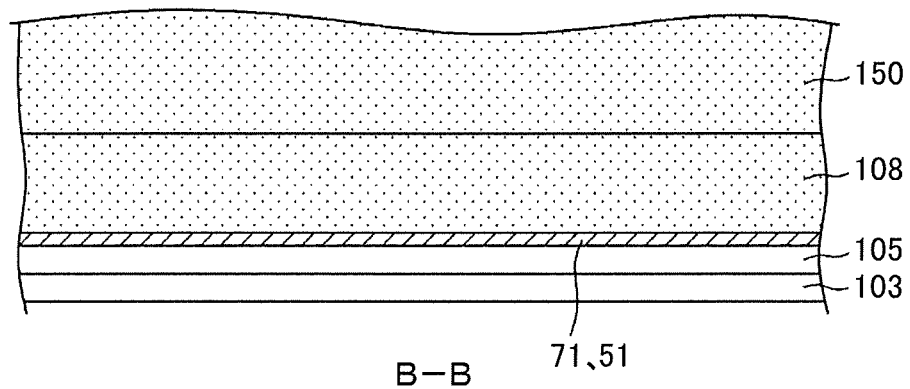
FIG. 8 is a cross sectional view of FIG. 6 along the B-B line.
Figure 9:
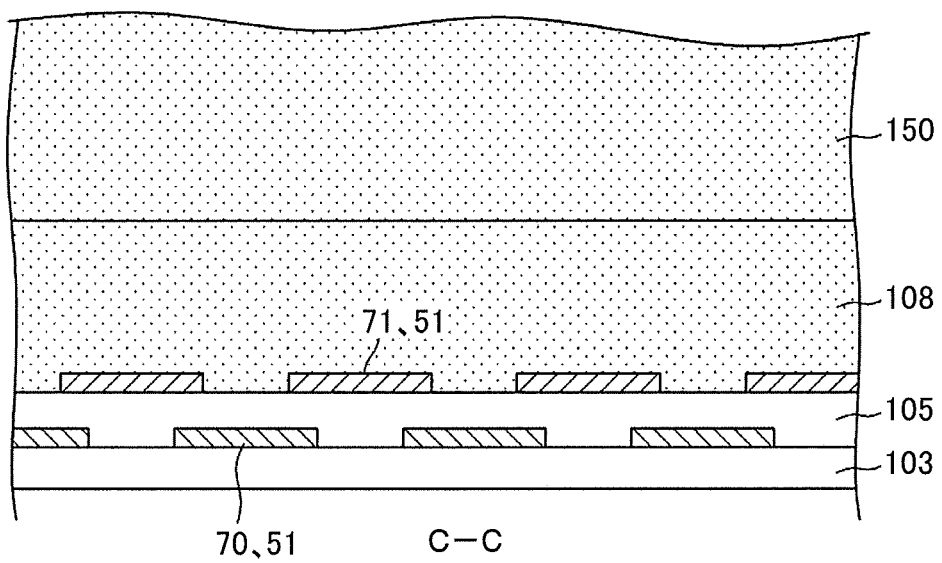
FIG. 9 is a cross sectional view of FIG. 6 along the C-C line.

FIG. 8 is a cross sectional view along the B-B line of FIG. 6. The wiring 71, 51, in FIG. 8, continuously stays on the same layer as the video signal line 12 is formed. Therefore, the adjacent wirings can be overlapped in a plan view; thus, the area for the tilted wiring region 50 can be decreased. FIG. 9 is the cross sectional view along the line C-C of FIG. 6. In FIG. 9, the space between the wirings is smaller than the width of the wiring. In the meantime, since the overlapping area increases, a danger of the short between the adjacent wirings increases.

Back to FIG. 6, the wirings in the tilted wiring region 50 may cross to each other in order to decrease the capacitance between the wirings; however FIG. 6 does not have the cross of the wirings to avoid complication of the figure. The inspection circuit 40 is located at the place the wirings again extend in the longitudinal direction (y direction) after the tilted wiring region 50.

The inspection circuit 40 depicted in FIG. 6 has many switches; those switches are formed by TFTs, consequently include many semiconductor layers 102. The inspection circuit 40 is protected by the organic passivation film 108, seal material 150, the counter substrate 200, and etc. as depicted in FIG. 5; thus, reliability of the inspection circuit 40 against the outer environment is maintained.

The role of the inspection circuit 40 is to inspect the disconnection in many wirings or the short among the many wirings. In the tilted wiring region 50, the tilted wirings 51 extending from the switches 61 in the selecting circuit 60 are formed. In the inspection circuit 40, the inspection switch 41 is formed for each of the tilted wirings 51. The role of the inspection switches 41 is to switch the connection of the tilted wiring to either one of the terminal wiring 81 or the inspection signal wiring 45. The terminal wirings 81 connect with the signal terminals 31, which the flexible wiring circuit substrate 500 is connected; the inspection signal wirings 45 connect with the inspection terminals 32, which are used for the inspection before the flexible wiring circuit substrate 500 is connected.

As depicted in FIG. 4, the inspection terminals 32 are disposed at the both sides of the group of signal terminals 31. The inspection signal wirings 45, which connect with the inspection terminals 32, extend in x direction and are arranged in y direction in the inspection circuit 40. The tilted wiring 51 connects with one of the inspection signal wirings 45 via inspection switches 41. When the inspection is conducted, the input to the inspection terminals 32 is subsequently switched; consequently, the disconnection and etc. are inspected in the tilted wirings 51 and the video signal lines 12, which are beyond the tilted wirings 51.

According to the structure of FIG. 6, the disconnection or the short in the wirings from the inspection circuit 40 to the display area 20 can be inspected. Larger area can be inspected by setting the inspection circuit 40 at very near the edge of the counter substrate 200.

The liquid crystal display device is generally AC driven. While there are the frame inversion system, the column inversion system and the dot inversion system in the AC driving method, currently, the column inversion system is adopted most. The column inversion system is that the polarities in the adjacent video signal lines are reversed.

In the tilted wiring region 50, the wirings 51 depicted in FIGS. 4 and 6 are multi layered to decrease the area for the wirings, namely, the wirings 51 are overlapped in a plan view. In this case, if the polarities between the adjacent wirings 51 are reversed, a period for writing the data becomes long due to the bigger capacitance between the wirings.

Figure 10:
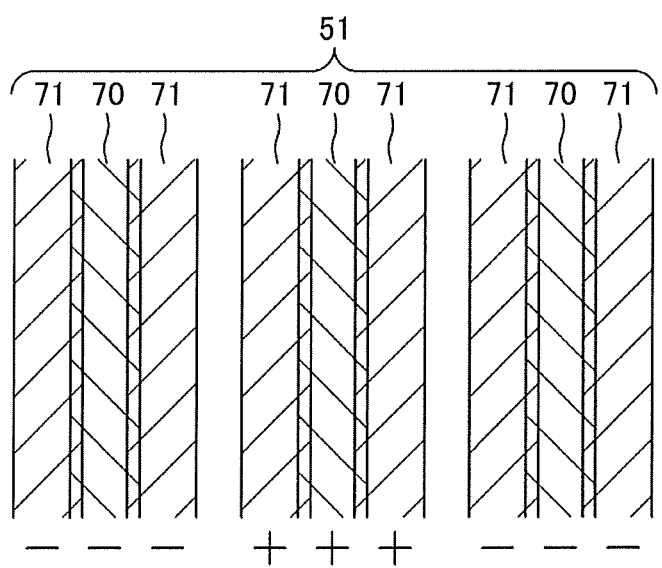
FIG. 10 is a plan view of an example of wirings in the tilted wiring region.

To prevent this phenomenon, there is a technology as e.g. three wirings of the same polarity are bound together and a space is set between the sets of three wirings of different polarity. In FIG. 10, negative signal voltage is applied to the left set of three wirings, positive signal voltage is applied to the center set of three wirings and negative signal voltage is applied to the right set of three wirings. The reason is that: if polarity is the same in the set of three wirings, the problem of capacitance between the wirings is mitigated.

Figure 11:
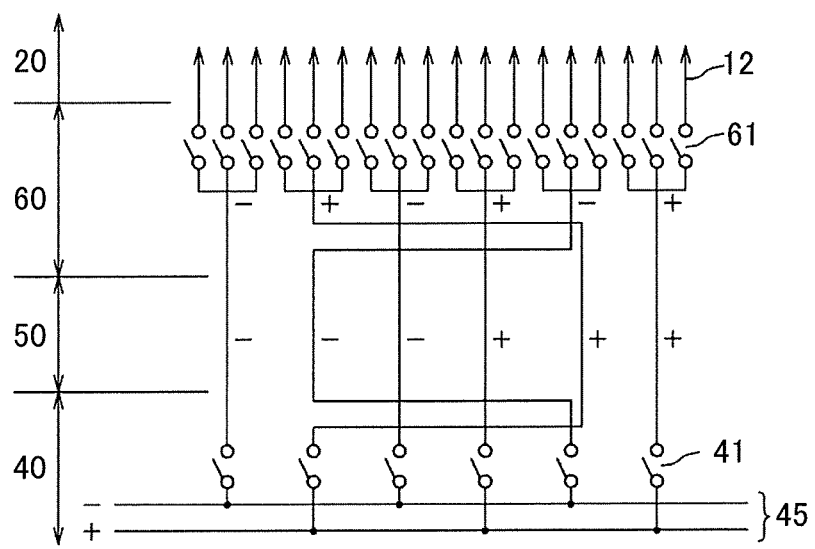
FIG. 11 is an example of the inspection circuit.

In this embodiment, as depicted in FIG. 11, a two wiring method is adopted. The two wiring method is that a pair of the inspection wirings 45 is constituted by two wirings, which voltages of different polarity are applied. In the tilted wiring region 50 in FIG. 11, negative voltage is applied to the left set of three wirings while positive voltage is applied to the right set of three wirings. In this structure, however, the short between the three wirings in the set cannot be tested. To realize more proper inspection, exchanges are made among the tilted wirings 51 connected to the switch 61 or the switch 41 in the selecting circuit 60 and the inspection circuit 40.

Figure 12:
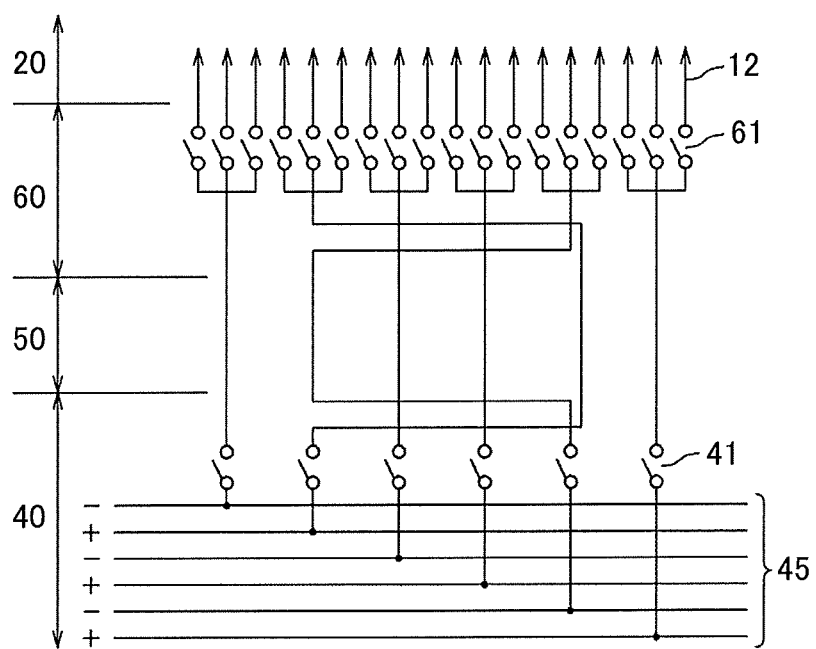
FIG. 12 is another example of the inspection circuit.

Only one pair of the inspection wirings 45 is shown in FIG. 11; however, six inspection terminals 32 are formed in the present embodiment, as shown in FIG. 4. Therefore, actually six inspection wirings 45 are formed in the inspection circuit 40 as depicted in FIG. 12. When the polarity is changed in every other adjacent wiring 45, the inspection of the disconnection or the short between adjacent wirings becomes possible even in a set of three wirings in the tilted wiring region 50 as depicted in FIG. 13.

Figure 13:
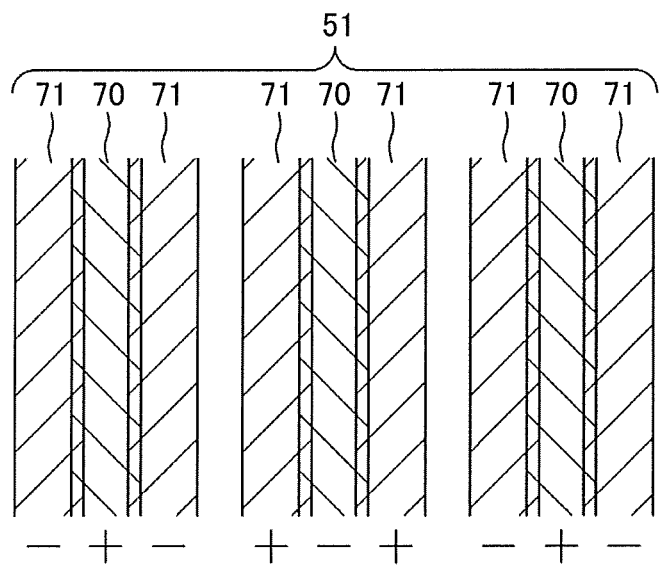
FIG. 13 is polarities of wirings when the inspection is conducted according to the inspection circuit of FIG. 12.

In the meantime, the polarities in the set of three wirings in FIG. 13 are only for the period for the inspection; in the time of display, however, the polarities are set as shown FIG. 10. Therefore, both of high speed data writing in the time of display and inspection of all the wirings in the inspection process are possible by adopting six polarities method in the inspection circuit 40.

Figure 14:
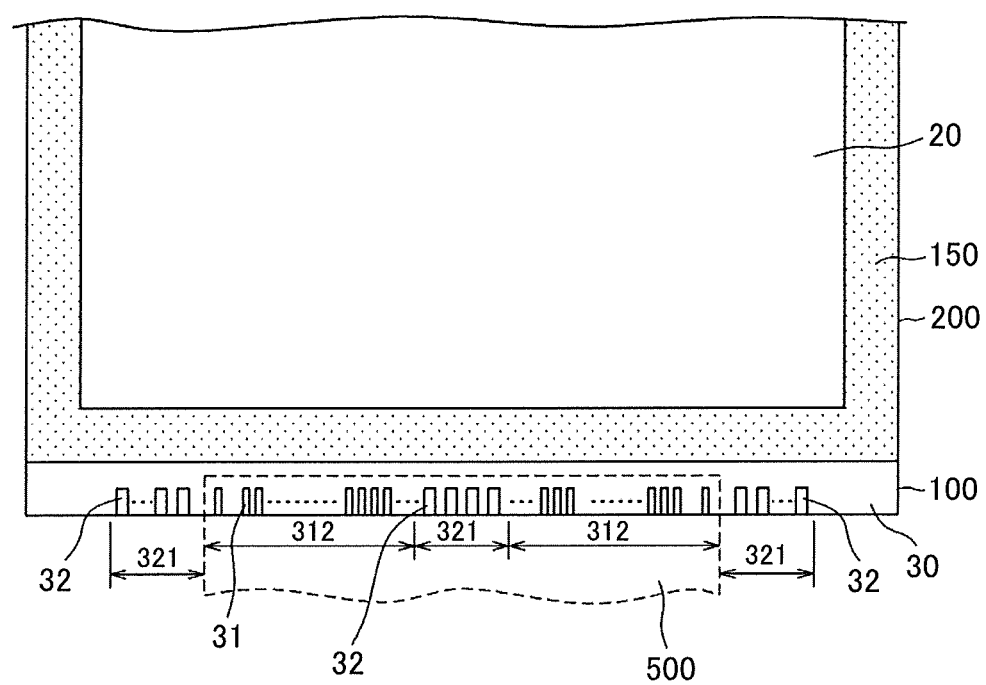
FIG. 14 is an enlarged plan view of the terminal area.

FIG. 14 is a plan view of modified configuration of the terminals 31, 32 in the terminal area 30 according to the present invention. The inspection terminals 32 and the signal terminals 31 for the video signals are set in the terminal area 30 in FIG. 14. The inspection of wirings is conducted before the flexible wiring circuit substrate 500 is connected; the inspection is made by contacting the probes of the tester to the inspection terminals, thus, the size of the inspection terminals 32 is bigger than the size of the signal terminals 31 for the video signals. In FIG. 14, the position of the flexible wiring circuit substrate 500 is depicted by the broken line. In FIG. 14, 321 is the area where the inspection terminals 32 are located and 312 is the area where the signal terminals 31 are located.

As depicted in FIG. 14, the terminal area 30 can be utilized efficiently by setting the inspection terminal area 321 at the both sides of the video signal terminal area 312 and at the central region of the terminal area 30, in other words, between the video signal terminal areas 312. In the inspection terminal area 321 at the central region of the terminal area, the terminal for the power or the terminal for the common electrode can be set because a large current flows in those terminals.

Such a configuration makes a width of the flexible wiring circuit 500 larger; however, when the tilting wirings are necessary between the inspection circuit 40 and the terminals 31, 32, tilting angle of the tilting circuit can be decreased, thus, it is possible to avoid the pitch between the tilting wirings to become too narrow.

As described above, according to the present invention, the inspection circuit can be set at the area protected by the counter substrate 200 and the seal material 150, etc. without decreasing efficiency of the inspection in the display device that the driver IC is not set in the terminal area but set in the flexible wiring circuit substrate 500. Therefore, the liquid crystal display device of high reliability can be realized.

<Modified Example>

Figure 20:
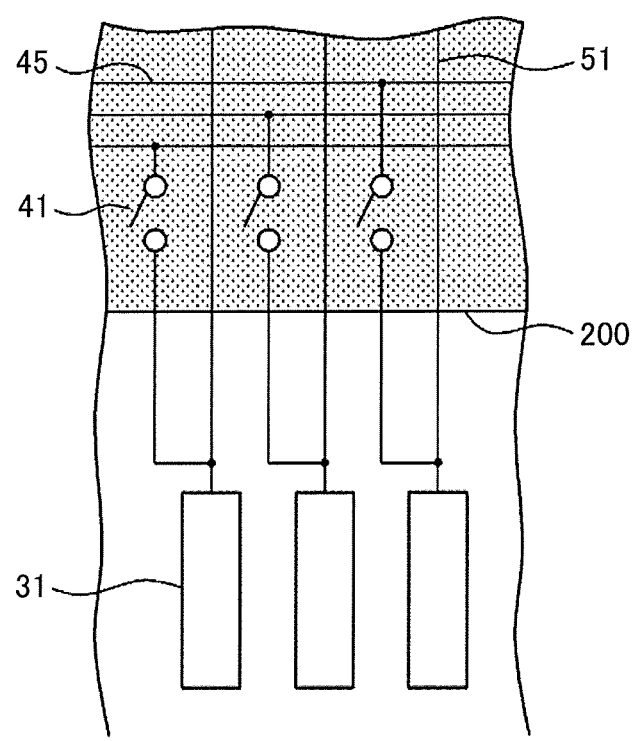
FIG. 20 is another example of the inspection circuit.

FIG. 20 is a modified example of the inspection circuit 40. In the example of FIG. 6, the wirings 51 between the inspection switches 41 and the signal terminals 31 cannot be tested because the inspection switches 41 are formed in the area inside of the counter substrate 200. On the contrary, in the inspection circuit 40 in FIG. 20, the connection between the wiring 51 and the inspection switch 41 is set near the signal terminal 31 beyond the edge of the counter substrate 200. Thus, the entire region of the wirings 51 can be inspected.

Embodiment 2

Figure 15:
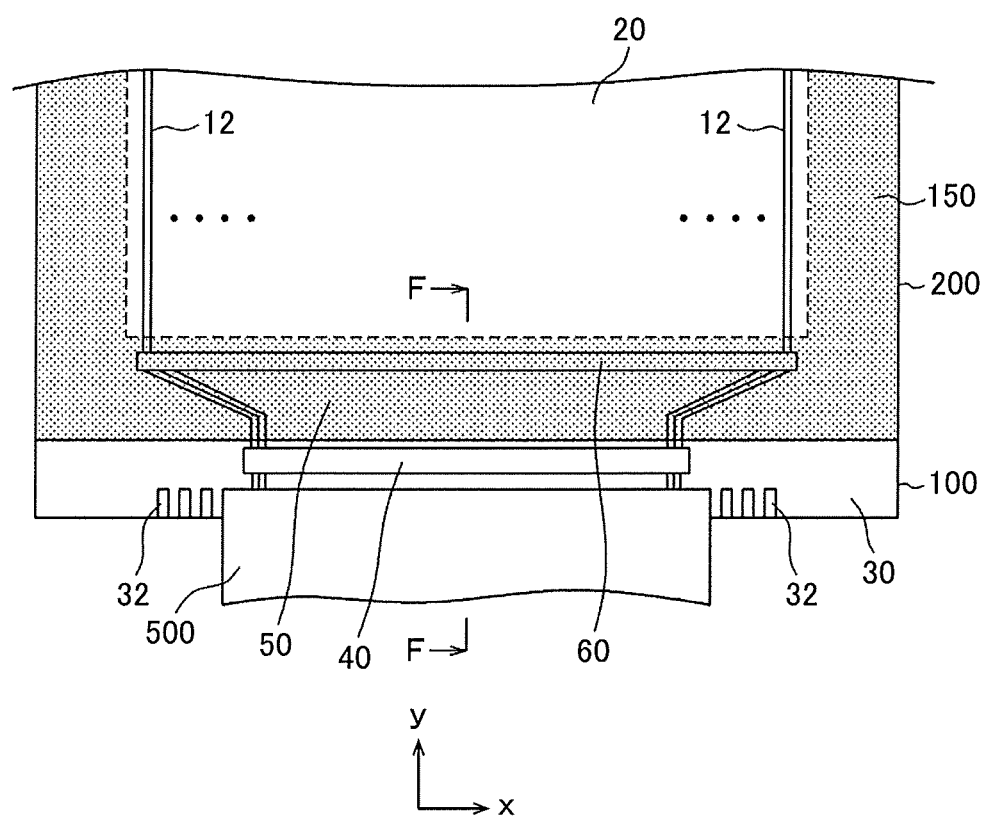
FIG. 15 is an enlarged plan view of the terminal area and its vicinity according to an embodiment 2.
Figure 21:
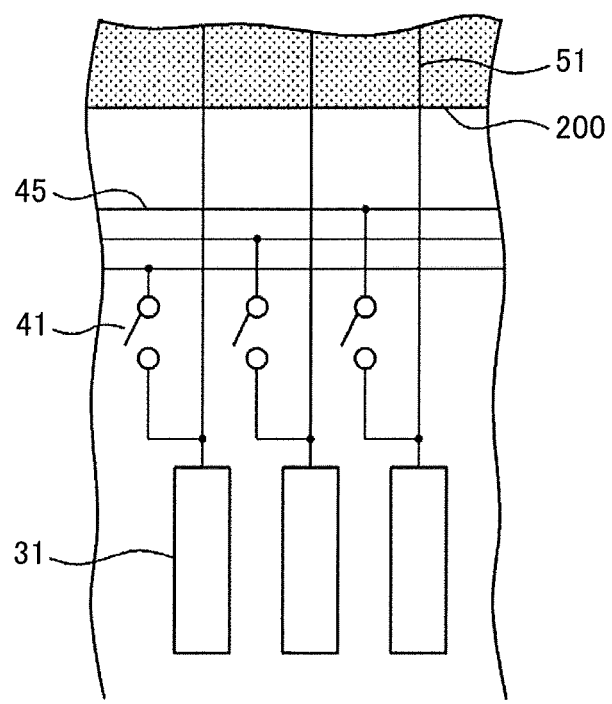
FIG. 21 is an example of the inspection circuit according to the embodiment 2.

FIG. 15 is another example of the display device, in which the driver IC is not installed in the terminal area but installed in the flexible wiring circuit substrate 500. A big difference between FIG. 15 and FIG. 4 is that the inspection circuit 40 is set adjacent to the edge of the flexible wiring circuit substrate 500 in FIG. 15. FIG. 21 is an example of the inspection circuit 40. The inspection circuit 40 is set in the terminal area 30 where the counter substrate 200 does not overlap in FIGS. 15 and 21. In this embodiment too, the connection between the wiring 51 and the inspection switch 41 is set near the signal terminal 31. The inspection area of the inspection circuit 40 covers almost all the display device. In other words, the inspection of the short and the disconnection in the wirings can be performed in all the area. In this embodiment, the inspection switches 41, themselves, are near the signal terminals 31, thus a layout of the wirings is easy.

Figure 16:
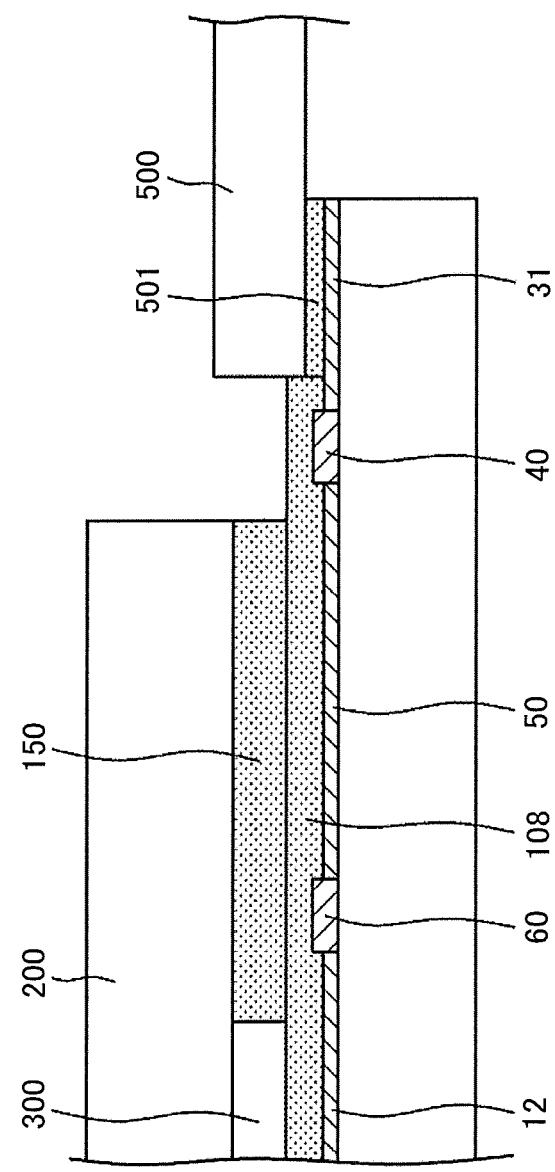
FIG. 16 is a cross sectional view of FIG. 15 along the F-F line.

On the other hand, in the structure of FIG. 15, the inspection circuit 40 is located between the counter substrate 200 and the flexible wiring circuit substrate 500 in a plan view; consequently, the organic passivation film 108 extends into the terminal area 30 to cover the inspection circuit 40, thus, the inspection circuit 40 can be protected. FIG. 16 is a cross sectional view of FIG. 15 along the line F-F. FIG. 16 differs from FIG. 5 of the embodiment 1 in that the inspection circuit 40 is located between the counter substrate 200 and the flexible wiring circuit substrate 500.

As described above, the present embodiment has a merit that the short and the disconnection of wirings can be inspected in almost all the area of the display device. In addition, the inspection circuit 40 can be protected since the organic passivation film 108 covers the inspection circuit 40.

Embodiment 3

In the embodiment 1 and the embodiment 2, the present invention was explained when it is applied to the liquid crystal display device. The present invention is, however, applicable to the organic EL display device since the organic EL display device, too, has video signal lines 12, scanning lines 11, etc. and many switches, which are formed by TFTs. In addition, the organic EL display device also has a demand to move the driver IC from the terminal area 30 to the flexile wiring circuit substrate 500 to reduce the terminal area 30, namely to reduce the frame area.

Figure 17:
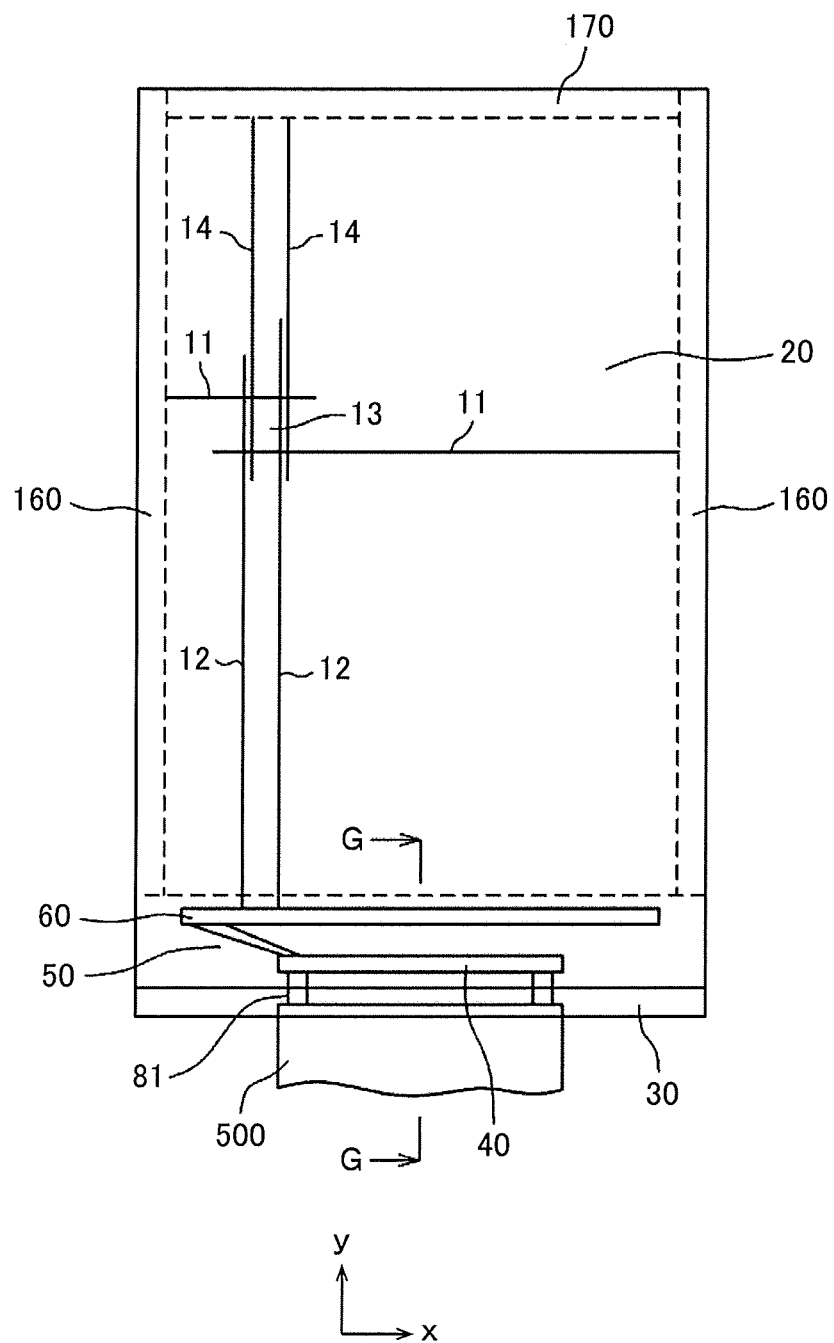
FIG. 17 is a plan view of the organic EL display device according to the present invention.

FIG. 17 is a plan view of the organic EL display device. In FIG. 17, the display area 20 and the terminal area 30 are formed; the driver IC is not installed in the terminal area 30 but only the flexible wiring circuit substrate 500 is connected to the terminal area 30. The scanning lines 11 extend in the lateral direction (x direction) and are arranged in the longitudinal direction (y direction). The video signal lines 12 extend in the longitudinal direction and are arranged in the lateral direction. In addition, the power lines 14 extend from upper part to the lower part of the display area 20. The power lines 14 supply current to the organic EL layers. The pixel 13 is formed in the area surrounded by the scanning lines 11 and the video signal lines 12 or in the area surrounded by the scanning lines 11 and the power lines 14.

The scanning line driving circuits 160 are formed at the both sides of the display area 20; the scanning lines 11 extend in the lateral direction (x direction) from the scanning line driving circuits 160 into the display area 20. The current supply area 170 is formed beyond the upper part of the display area 20; the current is supplied to each of the power lines 14 from the current supply area 170.

In FIG. 17, the selecting circuit 60 is located beyond the lower part of the display area 20; the video signal lines 12 extend in the longitudinal direction (y direction) from the selecting circuit 60 into the display area 20. The role of the selecting circuit 60 is the same as explained in the embodiment 1. The selecting circuit 60 and the inspection circuit 40 are connected through the tilting wiring region 50. The multi layered wirings are formed in the tilting wiring region 50. The structure of the tilting wiring region 50 is the same as explained in the embodiment 1.

The inspection circuit 40, like in the liquid crystal display device, detects the short between the wirings and the disconnection in the wirings. The switches in the inspection circuit 40 are formed by TFTs. In FIG. 17, the inspection circuit 40 is protected by the polarizing plate 408, adhesives 407, bank 403, the organic passivation film 108 and etc., which are explained later.

The inspection circuit 40 and the flexible wiring circuit substrate 500 are directly connected through the wirings 81. The wirings 81 extend in y direction in FIG. 17; it may become tilting wirings according to the relation between the width of the inspection circuit 40 and the width of the flexible wiring circuit substrate 500.

Figure 18:
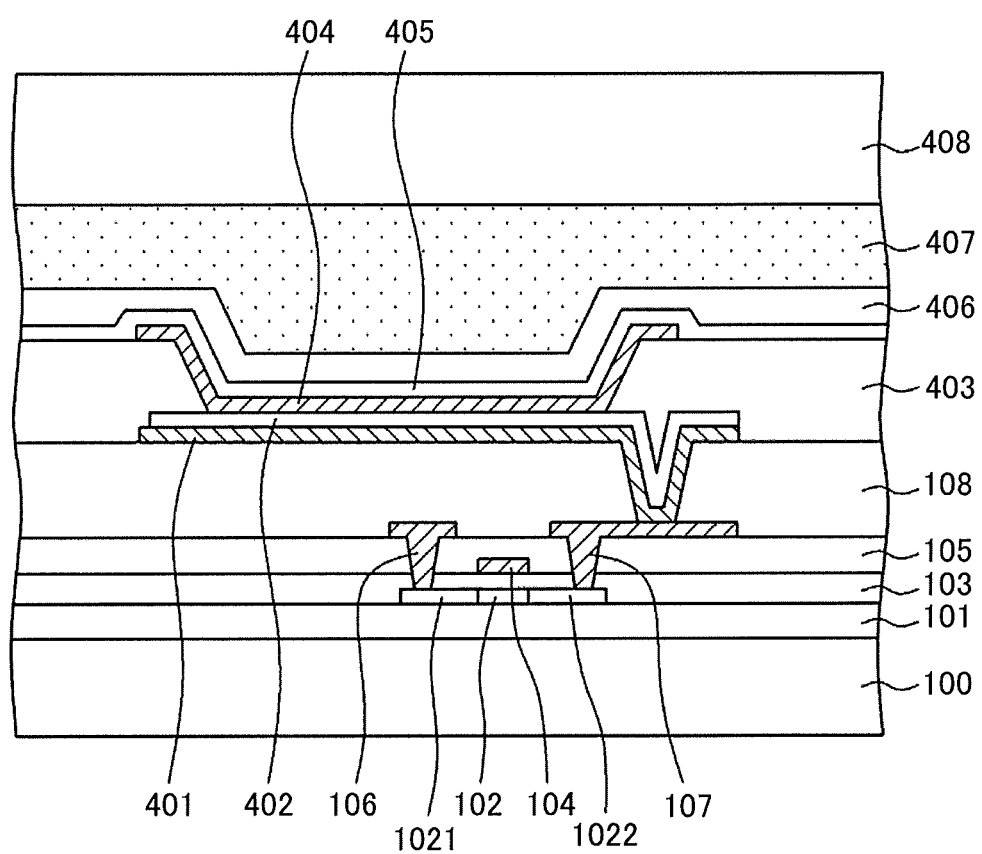
FIG. 18 is a cross sectional view of the display area of the organic EL display device.

FIG. 18 is a cross sectional view of the display area of the organic EL display device. The TFT in FIG. 18 is a driving transistor; however, the organic EL display device also uses many switching transistors. The basic structure of the switching transistor is the same as the driving transistor.

In FIG. 18, the structure is the same as in the case of the liquid crystal display device of FIG. 3 up to formation of the organic passivation film 108. In FIG. 18, the reflection electrode 401 made of e.g. Al and the transparent conductive film made of ITO, which works as an anode 402 are formed on the organic passivation film 108. The anode 402 connects with the source electrode 107 via through hole.

In FIG. 18, the bank 403 is formed covering the periphery of the anode 402. The bank 403 prevents the organic EL layer 404 from getting disconnection by the edge of the anode 402; the bank 403 also has a role to be a partition with the adjacent pixels. The organic EL layer 404, which includes the light emitting layer, is formed in the through hole of the bank 403; the hole is an area between the bank 403 and the bank 402 in FIG. 18. The organic EL layer 404 is formed by plural layers like the hole injection layer, the hole transportation layer, light emitting layer, the electron transportation layer and the electron injection layer.

The cathode 405 is formed covering the organic EL layer 404. The cathode 405 is made of a transparent electrode like e.g. the metal oxide conductive film, and is formed in common on all over the display area. In the meantime, the cathode 405 can be made of metal since the metal becomes transparent when it becomes a thin layer.

In FIG. 18, the protective layer 406 made of e.g. SiN is formed over the cathode 405. Since the organic EL layer 404 is weak to e.g. moisture, the protective layer 406 curbs intrusion of e.g. moisture to organic EL layer 405. The polarizing plate 408 is adhered on the protective layer 406 through the adhesive 407. The organic EL display device has the reflection electrode 401, consequently the external light is reflected, which deteriorates the visibility of the screen. The polarizing plate 408 suppresses the reflection of the external light.

When FIG. 18 is compared with FIG. 3 of embodiment 1, the structure from the TFT substrate 100 to the organic passivation film 108 is the same. As described in the embodiment 1, the structure of the TFT that is used in the display area is applicable to the structure of the TFT that is used in e.g. the inspection circuit 40.

Figure 19:
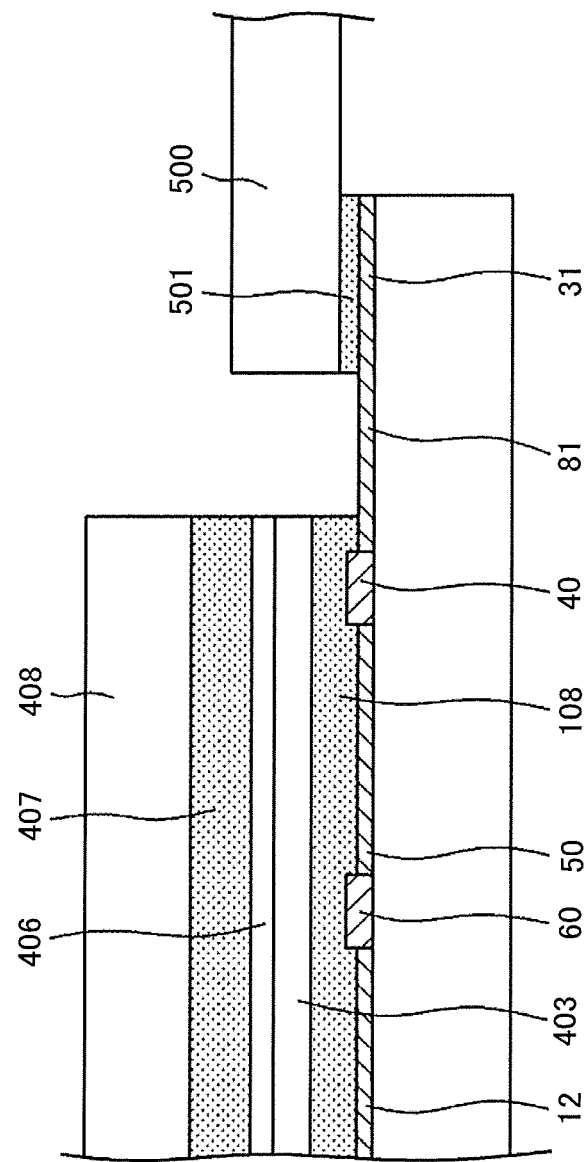
FIG. 19 is a cross sectional view of FIG. 17 along the G-G line.

FIG. 19 is a schematic cross sectional view of FIG. 17 along the line G-G. In FIG. 19, the organic passivation film 108 is formed over the video signal wirings 12, the tilting wirings 51, the inspection circuit 40, and etc. The organic film of e.g. acrylic, which constitutes the bank 403 is formed on the organic passivation film 108; the protective layer 406 made of e.g. SiN is formed on the bank 403. The polarizing plate 408 is adhered to the protective layer 406 through the adhesive 407.

In other words, even the elements over the inspection circuit 40 are different, basic structure of FIG. 19 is almost the same as the structure of the liquid crystal display device shown in FIG. 5 of the embodiment 1. Therefore, the contents explained in FIG. 4 through FIG. 9 are applicable to the organic EL display device. On the contrary, the organic EL display device is not driven by AC but driven by DC. Therefore, the means like combining the wirings of the same polarity in the tilting wiring region 50 to decrease the capacitance as described in FIG. 10 is not necessary.

In the meantime, the uppermost layer is the polarizing plate in FIGS. 17 and 19; however, there is a case that protecting plate made of glass or resin is set on or under the polarizing plate 408. In that case, the inspection circuit can be protected by the protecting plate instead of the polarizing plate 408.

What is claimed is:

1. An organic EL display device comprising:
    a TFT substrate having a display area, in which video signal lines are formed, and a terminal area;
    wherein an anode is formed on a first organic insulating film, an organic EL layer is formed on the anode, a cathode is formed on the organic EL layer, an inorganic insulating film is formed on the cathode, and a polarizing plate is set on the inorganic insulating film,
    a plurality of first terminals to connect with a flexible wiring circuit substrate and a plurality of second terminals utilized in an inspection process are formed in the terminal area,
    an inspection circuit is formed between the display area and the terminal area in a plan view in the TFT substrate,
    the inspection circuit has a plurality of switching portions to connect the video signal line to either one of the first terminals or one of the second terminals,
    the first organic insulating film is formed on the inspection circuit at a surface opposing to the polarizing plate.

2. The organic EL display device according to claim 1, wherein the inspection circuit further overlaps with the inorganic insulating film in a plan view.

3. The organic EL display device according to claim 1, wherein a second organic insulating film is formed between the first organic insulating film and the inorganic insulating film,
    the second organic insulating film overlaps with a periphery of the anode in a plan view.

* * * * *